United States Patent
Dinega et al.

(10) Patent No.: US 12,448,568 B2
(45) Date of Patent: Oct. 21, 2025

(54) ETCHING COMPOSITIONS

(71) Applicant: Fujifilm Electronic Materials U.S.A., Inc., N. Kingstown, RI (US)

(72) Inventors: Dmitry Dinega, Mesa, AZ (US); Thomas Dory, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 347 days.

(21) Appl. No.: 18/109,298

(22) Filed: Feb. 14, 2023

(65) Prior Publication Data

US 2023/0313041 A1    Oct. 5, 2023

Related U.S. Application Data

(60) Provisional application No. 63/318,498, filed on Mar. 10, 2022.

(51) Int. Cl.
C09K 13/06 (2006.01)
H01L 21/306 (2006.01)

(52) U.S. Cl.
CPC ........ C09K 13/06 (2013.01); H01L 21/30604 (2013.01)

(58) Field of Classification Search
None
See application file for complete search history.

(56) References Cited

U.S. PATENT DOCUMENTS

| | | | |
|---|---|---|---|
| 7,998,914 B2 | 8/2011 | Shimada et al. | |
| 8,790,160 B2* | 7/2014 | Lee | C09K 3/1463 451/36 |
| 8,883,652 B2 | 11/2014 | Yaguchi et al. | |
| 9,157,011 B2* | 10/2015 | Ashitaka | H01L 21/31053 |
| 9,546,321 B2 | 1/2017 | Barnes et al. | |
| 9,558,953 B2 | 1/2017 | Muro et al. | |
| 10,392,560 B2 | 8/2019 | Barnes et al. | |
| 10,676,668 B2 | 6/2020 | Yang et al. | |
| 11,180,697 B2 | 11/2021 | Liu et al. | |
| 2013/0276284 A1* | 10/2013 | Brosseau | H05K 3/22 29/426.1 |
| 2013/0303420 A1* | 11/2013 | Cooper | C11D 3/046 510/175 |
| 2013/0336857 A1* | 12/2013 | Korzenski | C22B 15/0006 423/1 |
| 2014/0170852 A1* | 6/2014 | Noller | C09G 1/02 438/692 |
| 2014/0191019 A1* | 7/2014 | Chen | B09B 3/00 228/19 |
| 2015/0162213 A1 | 6/2015 | Chen et al. | |
| 2016/0130500 A1* | 5/2016 | Chen | C11D 7/06 216/13 |
| 2017/0145311 A1 | 5/2017 | Liu et al. | |
| 2020/0190673 A1 | 6/2020 | Lippy et al. | |
| 2021/0071078 A1 | 3/2021 | Takahashi et al. | |
| 2021/0324525 A1 | 10/2021 | Das et al. | |
| 2023/0052829 A1* | 2/2023 | Huang | C09G 1/04 |
| 2023/0203409 A1* | 6/2023 | Wada | C11D 17/0008 510/254 |
| 2024/0026254 A1* | 1/2024 | Yamada | C11D 7/3281 |

FOREIGN PATENT DOCUMENTS

| | | |
|---|---|---|
| CN | 110095952 | 8/2019 |
| JP | 2013135081 | 7/2013 |
| JP | 5396514 | 1/2014 |
| KR | 20110104106 | 9/2011 |
| KR | 20210117570 | 9/2021 |
| WO | WO 2020/146748 | 7/2020 |
| WO | WO 2020/252272 A1 | 12/2020 |

OTHER PUBLICATIONS

Invitation to Pay Additional Fees and, Where Applicable, Protest Fee in International Appln. No. PCT/US2023/013015, mailed on May 4, 2023, 2 pages.
International Preliminary Report on Patentability in International Appln. No. PCT/US2023/013015, mailed on Sep. 19, 2024, 9 pages.
International Search Report and Written Opinion in International Appln. No. PCT/US2023/013015, mailed on Jul. 25, 2023, 23 pages.
Extended European Search Report in European Appln. No. 23767288.6, mailed on May 26, 2025, 8 pages.

* cited by examiner

*Primary Examiner* — Allan W. Olsen
(74) *Attorney, Agent, or Firm* — Fish & Richardson P.C.

(57) ABSTRACT

The present disclosure is directed to etching compositions that are useful for, e.g., selectively removing silicon from a semiconductor substrate as an intermediate step in a multi-step semiconductor manufacturing process.

15 Claims, No Drawings

ETCHING COMPOSITIONS

CROSS-REFERENCE TO RELATED APPLICATION

The present application claims priority to U.S. Provisional Application Ser. No. 63/318,498, filed on Mar. 10, 2022, the contents of which are hereby incorporated by reference in their entirety.

FIELD OF THE DISCLOSURE

The present disclosure relates to etching compositions and processes of using etching compositions. In particular, the present disclosure relates to etching compositions that can selectively etch silicon in the presence of other exposed or underlying materials, such as metal conductors (e.g., copper), gate materials (e.g., SiGe), barrier materials, insulator materials (e.g., low-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Silicon (Si) can be utilized in the manufacturing of semiconductor devices, liquid crystal displays, MEMS (Micro Electro Mechanical Systems), printed wiring boards and the like. For example, it can be used as a sacrificial material in a process of manufacturing a multigate device, such as a multiple-gate field-effect transistor (FET) (e.g., a gate-all-around FET (GAA FET)). In particular, an epi-stack (i.e., an epitaxially grown stack) can be formed of alternating silicon (Si) and silicon germanium alloy (SiGe) layers, wherein the Si layers are the sacrificial layers and the SiGe layers are the channel layers. The Si layers can then be removed by selective etching (for example via a wet etching process), which also inadvertently recesses trenches into the bulk substrate due to the similarity of materials composing the sacrificial layers and the substrate. The SiGe layers can subsequently be formed into the nanowire channels suspended over the trenches. A thin gate dielectric is then disposed around the SiGe nanowire channels and over the recessed trenches of the substrate. Metal is then disposed over the dielectric to form the metal gate electrode of the GAA MOSFET.

SUMMARY OF THE DISCLOSURE

In the construction of semiconductor devices, silicon (Si) frequently needs to be etched. In the various types of uses and device environments of Si, other layers are in contact with or otherwise exposed at the same time as this material is etched. Highly selective etching of the Si in the presence of these other materials (e.g. metal conductors, dielectrics, channel materials, gate materials, and hard masks) is typically needed for device yield and long life.

The present disclosure relates to compositions and processes for selectively etching Si (e.g., polysilicon) relative to hard mask layers, gate materials (e.g., SiGe, SiN, or SiOx) and/or low-k dielectric layers (e.g., SiN, SiOx, carbon doped oxide, or SiCO) that are present in the semiconductor device. More specifically, the present disclosure relates to compositions and processes for selectively etching Si relative to SiOx and/or SiN.

In one aspect, this disclosure features an etching composition that includes at least one quaternary ammonium hydroxide or a salt thereof, at least one oxidizing agent, at least one polyamine, and water, wherein the composition has a pH of at least about 13.

In another aspect, this disclosure features a method that includes contacting a semiconductor substrate supporting a Si-containing feature with an etching composition described herein to substantially remove the Si-containing feature.

In still another aspect, this disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.). As used herein, the terms "layer" and "film" are used interchangeably.

In general, the disclosure features an etching composition (e.g., an etching composition for selectively removing Si) that includes (e.g., comprising or consisting of) at least one quaternary ammonium hydroxide or a salt thereof, at least one oxidizing agent, at least one polyamine, and water. In some embodiments, the etching composition contains these four types of components only. In some embodiments, the Si to be removed is amorphous silicon or polysilicon (poly-Si), such as doped poly-Si (e.g., n-type poly-Si). The doped poly-Si can include a suitable dopant, such as phosphorus.

In some embodiments, the etching composition of this disclosure can include at least one (e.g., two, three, or four) quaternary ammonium hydroxide or a salt thereof. The quaternary ammonium hydroxide or a salt thereof described herein can be a tetraalkylammonium hydroxide or a salt thereof (e.g., a fluoride, chloride, or bromide salt). In some embodiments, each alkyl group in the tetraalkylammonium hydroxide, independently, is a $C_1$-$C_{18}$ alkyl optionally substituted by OH or aryl (e.g., phenyl). Examples of suitable tetraalkylammonium hydroxides or a salt thereof include tetramethylammonium hydroxide (TMAH), tetraethylammonium hydroxide, tetrapropylammonium hydroxide, tetrabutylammonium hydroxide, benzyltrimethylammonium hydroxide (BTMAH), methyltriethylammonium hydroxide, ethyltrimethylammonium hydroxide (ETMAH), dimethyldiethylammonium hydroxide, 2-hydroxyethyltrimethylammonium hydroxide, tetraethanolammonium hydroxide, benzyltriethylammonium hydroxide, benzyltributylammonium hydroxide, hexadecyltrimethylammonium hydroxide, and a salt thereof.

In some embodiments, the at least one quaternary ammonium hydroxide or a salt thereof is in an amount of at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 2 wt %, at least about 3 wt %, at least about 4 wt %, or at least about 5 wt %) to at most about 20 wt % (e.g., at most about 18 wt %, at most about 16 wt %, at most about 15 wt %, at most about 14 wt %, at most about 12 wt %, at most about 10 wt %, at most about 8 wt %, at most about 7 wt %, at most about 6 wt %, at most about 5 wt %, at most about 4 wt %, at most about 2 wt %, or at most about 1 wt %) of the etching composition of this disclosure. Without wishing to be bound by theory, it is believed that the quaternary ammonium hydroxide or a salt thereof can facilitate and enhance the removal of Si on a semiconductor substrate during the etching process.

The etching composition of this disclosure can include at least one (e.g., two, three, or four) oxidizing agent. Examples of suitable oxidizing agents include periodic acid, perchloric acid, and hydrogen peroxide.

In some embodiments, the at least one oxidizing agent can be from at least about 0.01 wt % (e.g., at least about 0.02 wt %, at least about 0.05 wt %, at least about 0.08 wt %, at least about 0.1 wt %, at least about 0.2 wt %, at least about 0.3 wt %, at least about 0.5 wt %, at least about 1 wt %, at least about 2 wt %, or at least about 3 wt %) to at most about 5 wt % (e.g., at most about 4.5 wt %, at most about 4 wt %, at most about 3.5 wt %, at most about 3 wt %, at most about 2.5 wt %, at most about 2 wt %, at most about 1.5 wt %, at most about 1 wt %, at most about 0.9 wt %, or at most about 0.5 wt %) of the etching composition of this disclosure. Without wishing to be bound by theory, it is believed that the oxidizing agent can facilitate and enhance the removal of Si (e.g., poly-Si or doped poly-Si) on a semiconductor substrate (e.g., in high aspect vials).

In general, the etching composition of this disclosure can include at least one (e.g., two, three, or four) polyamine. In some embodiments, the polyamine can include a diamine (e.g., a diamine without functional groups (e.g., hydroxyl) other than an amino group), a triamine (e.g., a triamine without functional groups (e.g., hydroxyl) other than an amino group), or an alkanolamine (e.g., an alkanolamine containing at least two amino groups).

As used herein, the term "alkanolamine" refers to a compound that includes at least one (e.g., two, three, or four) amino group and at least one (e.g., two, three, or four) hydroxyl group. In some embodiments, the alkanolamine can be a compound of formula (I): $OR_3—R—N(R_1R_2)$ (I), in which R is $C_1$-$C_6$ straight or branched alkylene, and each of $R_1$, $R_2$, and $R_3$, independently is H, $C_3$-$C_6$ cycloalkyl, or $C_1$-$C_6$ alkyl optionally substituted by OH or $NH_2$. An example of a suitable alkanolamine is N-(3-aminopropyl)-diethanolamine.

In some embodiments, the polyamine can be a compound of formula (I): $N(R_3R_4)—R—N(R_1R_2)$ (I), in which R is $C_1$-$C_6$ straight or branched alkylene, and each of $R_1$, $R_2$, $R_3$, and $R_4$, independently is H, $C_3$-$C_6$ cycloalkyl, or $C_1$-$C_6$ alkyl optionally substituted by OH or $N(R)_2$, and each R, independent, is $C_1$-$C_6$ alkyl. An example of a suitable triamine is pentamethyldiethylenetriamine.

In some embodiments, the at least one polyamine can be from at least about 0.001 wt % (e.g., at least about 0.002 wt %, at least about 0.005 wt %, at least about 0.01 wt %, at least about 0.02 wt %, at least about 0.04 wt %, at least about 0.05 wt %, at least about 0.06 wt %, at least about 0.08 wt %, at least about 0.1 wt %, at least about 0.2 wt %, or at least about 0.5 wt %) to at most about 1 wt % (e.g., at most about 0.8 wt %, at most about 0.6 wt %, at most about 0.5 wt %, at most about 0.4 wt %, at most about 0.2 wt %, at most about 0.1 wt %, at most about 0.08 wt %, at most about 0.06 wt %, or at most about 0.05 wt %) of the etching composition of this disclosure. Without wishing to be bound by theory, it is believed that the polyamine can reduce or minimize the corrosion or removal of SiN and/or SiOx on a semiconductor substrate.

In general, the etching composition of this disclosure can include water as a solvent. In some embodiments, the water can be de-ionized and ultra-pure, contain no organic contaminants, and/or have a minimum resistivity of about 4 to about 17 mega Ohms or at least about 17 mega Ohms. In some embodiments, the water is in an amount of from at least about 70 wt % (e.g., at least about 75 wt %, at least about 80 wt %, at least about 82 wt %, at least about 84 wt %, at least about 85 wt %, at least about 86 wt %, at least about 88 wt %, at least about 90 wt %, at least about 91 wt %, or at least about 92 wt %) to at most about 99 wt % (e.g., at most about 98 wt %, at most about 97 wt %, at most about 96 wt %, at most about 95 wt %, at most about 94 wt %, at most about 93 wt %, at most about 92 wt %, at most about 91 wt %, at most about 90 wt %, at most about 85 wt %, or at most about 80 wt %) of the etching composition. Without wishing to be bound by theory, it is believed that, if the amount of water is greater than 99 wt % of the composition, it would adversely impact the Si etch rate, and reduce its removal during the etching process. On the other hand, without wishing to be bound by theory, it is believed that the etching composition of this disclosure should include a certain level of water (e.g., at least about 70 wt %) to avoid reduction in the etching performance.

In some embodiments, the etching composition of this disclosure can optionally include at least one (e.g., two, three, or four) organic solvent. In some embodiments, the organic solvent can be a water soluble organic solvent. As defined herein, a "water soluble" substance (e.g., a water soluble organic solvent) refers to a substance having a solubility of at least 1% by weight in water at 25° C. In some embodiments, the organic solvent can be selected from the group consisting of water soluble alcohols (e.g., alkane diols or glycols such as alkylene glycols), water soluble ketones, water soluble esters, and water soluble ethers (e.g., glycol ethers). Examples of suitable organic solvents include glycerol, propylene glycol, hexylene glycol, 1,3-propanediol, ethylene glycol butyl ether, 3-methoxy-3-methyl-1-butanol, acetone, cyclohexanone, ethyl acetate, and propylene glycol monoethyl ether acetate.

In some embodiments, the at least one organic solvent can be from at least about 5 wt % (e.g., at least about 10 wt %, at least about 15 wt %, at least about 20 wt %, at least about 25 wt %, at least about 30 wt %, at least about 35 wt %, or at least about 40 wt %) to at most about 75 wt % (e.g., at most about 70 wt %, at most about 65 wt %, at most about 60 wt %, at most about 55 wt %, at most about 50 wt %, at most about 45 wt %, or at most about 40 wt %) of the etching composition. In some embodiments, the etching composition of this disclosure can be substantially free of an organic solvent.

In some embodiments, the etching composition of this disclosure can have a pH of at least about 13 (e.g., at least about 13.1, at least about 13.2, at least about 13.3, at least about 13.4, or at least about 13.5) and/or at most about 14 (e.g., at most about 13.9, at most about 13.8, at most about 13.7, at most about 13.6, or at most about 13.5). Without wishing to be bound by theory, it is believed that an etching composition having a pH lower than 13 would not have a sufficient Si removal rate and/or a sufficient bath loading capacity.

In some embodiments, the etching compositions of this disclosure can optionally include at least one (e.g., two, three, or four) pH adjusting agent (e.g., an acid or a base) to control the pH to from about 13 to about 14. The amount of the pH adjusting agent required, if any, can vary as the concentrations of the other components (e.g., the quaternary ammonium hydroxide and the polyamine) are varied in different formulation. In some embodiments, the pH adjusting agent can be at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 1.2 wt %, at least about 1.4 wt %, or at least about 1.5 wt %) and/or at most about 3 wt % (e.g., at most about 2.8 wt %, at most about 2.6 wt %, at most about 2.5 wt %, at most about 2.4 wt %, at most about 2.2 wt %, at most about 2 wt %, or at most about 1.8 wt %) of the etching composition. In some embodiments, the etching composition of this disclosure can be substantially free of a pH adjusting agent.

In some embodiments, the pH adjusting agent is free of any metal ion (except for a trace amount of metal ion impurities). Suitable metal ion free pH adjusting agents include acids and bases. Suitable acids that can be used as a pH adjusting agent include organic acids (e.g., carboxylic acids) and inorganic acids. Exemplary carboxylic acids include, but are not limited to, monocarboxylic acids, bicarboxylic acids, tricarboxylic acids, α-hydroxyacids and β-hydroxyacids of monocarboxylic acids, α-hydroxyacids or β-hydroxyacids of bicarboxylic acids, or α-hydroxyacids and β-hydroxyacids of tricarboxylic acids. Examples of suitable carboxylic acids include citric acid, maleic acid, fumaric acid, lactic acid, glycolic acid, oxalic acid, tartaric acid, succinic acid, and benzoic acid. Examples of suitable inorganic acids include phosphoric acid, nitric acid, sulfuric acid, and hydrochloric acid.

Suitable bases that can be used as a pH adjusting agent include ammonium hydroxide, monoamines (including alkanolamines), and cyclic amines. Examples of suitable monoamines include, but are not limited to, triethylamine, tributylamine, tripentylamine, diethylamine, butylamine, dibutylamine, and benzylamine. Examples of suitable alkanolamines include, but are not limited to, monoethanolamine, diethanolamine, triethanolamine, and aminopropyldiethanolamine. Examples of suitable cyclic amines include, but are not limited to, 1,8-diazabicyclo[5.4.0]-7-undecene (DBU), 1,5-diazabicyclo[4.3.0]-5-nonene (DBN), and octahydro-2H-quinolizine.

In some embodiments, the etching composition of the present disclosure can contain additives such as, pH adjusting agents, corrosion inhibitors, surfactants, additional organic solvents, biocides, and defoaming agents as optional components. Examples of certain suitable additives include alcohols (e.g., polyvinyl alcohol and sugar alcohols), organic acids (e.g., iminidiacetic acid, malonic acid, oxalic acid, succinic acid, and malic acid), and inorganic acids (e.g., boric acid). Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants can be cationic, anionic, nonionic, and amphoteric surfactants.

In general, the etching composition of the present disclosure can have a relatively high Si/dielectric material (e.g., SiN, SiOx, or SiCO) removal rate selectivity (i.e., a high ratio of Si removal rate over dielectric material removal rate). In some embodiments, the etching composition can have a Si/dielectric material removal rate selectivity of at least about 10 (e.g., at least about 20, at least about 40, at least about 50, at least about 60, at least about 80, at least about 100, at least about 150, at least about 200, at least about 250, at least about 300, at least about 350, at least about 400, at least about 450, or at least about 500) and/or at most about 5000 (e.g., at most about 4000, at most about 3000, at most about 2000, or at most about 1000).

In some embodiments, the etching compositions of the present disclosure can be substantially free of one or more of additive components, in any combination, if more than one. Such components are selected from the group consisting of organic solvents, polymers (e.g., non-ionic, cationic, or anionic polymers), oxygen scavengers, quaternary ammonium compounds (e.g., salts or hydroxides), alkaline bases (such as NaOH, KOH, LiOH, Mg(OH)$_2$, and Ca(OH)$_2$), surfactants (e.g., cationic, anionic, or non-ionic surfactants), defoamers, fluorine-containing compounds (e.g., fluoride compounds or fluorinated compounds (such as fluorinated polymers/surfactants)), silicon-containing compounds such as silanes (e.g., alkoxysilanes), nitrogen-containing compounds (e.g., amino acids, amines, imines (e.g., amidines such as 1,8-diazabicyclo[5.4.0]-7-undecene (DBU) and 1,5-diazabicyclo[4.3.0]non-5-ene (DBN)), amides, or imides), abrasives (e.g., ceria abrasives, non-ionic abrasives, surface modified abrasives, negatively/positively charged abrasive, or ceramic abrasive composites), plasticizers, oxidizing agents (e.g., peroxides such as hydrogen peroxide, and periodic acid), corrosion inhibitors (e.g., azole or non-azole corrosion inhibitors), electrolytes (e.g., polyelectrolytes), silicates, cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), chelating agents, buffering agents, acids such as organic acids (e.g., carboxylic acids such as hydroxycarboxylic acids, polycarboxylic acids, and sulfonic acid) and inorganic acids (e.g., sulfuric acid, sulfurous acid, nitrous acid, nitric acid, phosphorous acid, and phosphoric acid), salts (e.g., halide salts or metal salts), and catalysts (e.g., metal-containing catalysts). In some embodiments, the composition is substantially free of a salt other than a quaternary ammonium salt. As used herein, a component that is "substantially free" from an etching composition refers to an ingredient that is not intentionally added into the etching composition. In some embodiments, the etching composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above components that are substantially free from the etching composition. In some embodiments, the etching compositions described herein can be completely free of one or more of the above components.

The etching composition of this disclosure can be prepared by simply mixing the components together, or can be prepared by blending two or more compositions (each containing certain components of an etching composition described herein) in a kit.

In some embodiments, the present disclosure features a method of etching a semiconductor substrate that includes at least one Si-containing feature. The method can include contacting a semiconductor substrate containing the at least one Si-containing feature with an etching composition of this disclosure to substantially remove the Si-containing feature. In some embodiments, the semiconductor substrate can include a pattern on a surface and the Si-containing feature film is a part of the pattern. In some embodiments, the method can further include rinsing the semiconductor substrate with a rinse solvent after the contacting step and/or drying the semiconductor substrate after the rinsing step.

In some embodiments, the method does not substantially remove a metal conductor (e.g., Cu) or a dielectric material (e.g., SiN, SiOx, or SiCO) in the semiconductor substrate. For example, the method does not remove more than about 5% by weight (e.g., more than about 3% by weight or more than about 1% by weight) of a metal conductor or a dielectric material in the semiconductor substrate.

In some embodiments, the etching method includes the steps of:
(A) providing a semiconductor substrate containing a Si-containing feature (e.g., in a pattern);
(B) contacting the semiconductor substrate with an etching composition described herein;
(C) rinsing the semiconductor substrate with one or more suitable rinse solvents; and
(D) optionally, drying the semiconductor substrate (e.g., by any suitable means that removes the rinse solvent and does not compromise the integrity of the semiconductor substrate).

The semiconductor substrates to be etched in this method can contain organic and organometallic residues, and a range of metal oxides, some or all of which may also be removed during the etching process.

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates can also contain layers of interlayer dielectrics, polysilicon, silicon oxide, silicon nitride, silicon germanium, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 50° C. to about 85° C., from about 60° C. to about 80° C., or from about 65° C. to about 75° C.). The etch rates of Si increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 60 minutes (e.g., from about 10 minutes to about 60 minutes, from about 20 minute to about 60 minutes, or from about 30 minute to about 60 minutes).

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate, and propylene glycol monomethyl ether acetate. Alternatively, or in addition, aqueous rinses with pH>8 (such as dilute aqueous ammonium hydroxide) can be employed. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying, and any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

While the invention has been described in detail with reference to certain embodiments thereof, it will be understood that modifications and variations are within the spirit and scope of that which is described and claimed.

The present disclosure is illustrated in more detail with reference to the following examples, which are for illustrative purposes and should not be construed as limiting the scope of the present disclosure.

EXAMPLES

General Procedure 1
Formulation Blending
Samples of etching compositions were prepared by adding, while stirring, to the calculated amount of the solvent the remaining components of the formulation.

General Procedure 2

Materials and Methods

Blanket film etch rate measurements on films were carried out using commercially available unpatterned 300 mm diameter wafers that were diced into 0.5"×1.0" test coupons for evaluation. Primary blanket film materials used for testing include 1) a polysilicon (poly-Si) film of about 3000 Å thickness deposited on a silicon substrate; 2) a SiN film of about 140 Å thickness deposited on a silicon substrate, and 3) a SiOx film of about 1200 Å thickness deposited on a silicon substrate.

The blanket film test coupons were measured for pre-treatment and post-treatment thickness to determine blanket film etch rates. For the poly-Si, SiN, and SiOx blanket films, the film thicknesses were measured pre-treatment and post-treatment by Ellipsometry using a Woollam VASE.

General Procedure 3

Etching Evaluation with Beaker Test

All blanket film etch testing was carried out at 70° C. or 75° C. in a 600 mL glass beaker containing 200 g of a sample solution with continuous stirring at 250 rpm, with the Parafilm® cover in place at all times to minimize evaporative losses. All blanket test coupons having a blanket film exposed on one side to the sample solution were diced by diamond scribe into 0.5"×1.0" square test coupon size for beaker scale testing. Each individual test coupon was held into position using a single 4" long, locking plastic tweezers clip. The test coupon, held on one edge by the locking tweezers clip, was suspended into the 600 mL HDPE beaker and immersed into the 200 g test solution while the solution was stirred continuously at 250 rpm at 75° C. Immediately after each sample coupon was placed into the stirred solution, the top of the 600 mL HDPE beaker was covered and resealed with Parafilm®. The test coupons were held static in the stirred solution until the treatment time (0.5 minutes or 60 minutes) had elapsed.

After the treatment time in the test solution had elapsed, the sample coupons were immediately removed from the 600 mL HDPE beaker and rinsed. Specifically, the coupon was immersed in a 300 mL volume of ultra-high purity deionized (DI) water for 15 seconds with mild agitation, which was followed by immersion in 300 mL of isopropyl alcohol (IPA) for 15 seconds with mild agitation, and a final rinse by immersion in 300 mL of IPA for 15 seconds with mild agitation. After the final IPA rinse step, all test coupons were subject to a filtered nitrogen gas blow off step using a hand held nitrogen gas blower which forcefully removed all traces of IPA to produce a final dry sample for test measurements.

Example 1

Formulation Examples 1-12 (FE-1 to FE-12) were prepared according to General Procedure 1, and evaluated according to General Procedures 2 and 3. The formulations containing a polyamine (i.e., FE-1 to FE-8) and their test results are summarized in Table 1. The poly-Si etch rates were measured after immersing a test coupon in a formulation for 0.5 minutes at 75° C. The SiN and SiOx etch rates were measured after immersing a test coupon in a formulation for 60 minutes at 75° C.

TABLE 1

| Composition [wt %] | FE-1 | FE-2 | FE-3 | FE-4 | FE-5 | FE-6 | FE-7 | FE-8 |
|---|---|---|---|---|---|---|---|---|
| TMAH | 7% | 7% | 7% | 7% | 7% | 7% | 7% | 7% |
| Periodic acid | 0.9% | 0.9% | 0.9% | 0.9% | 0.9% | 0.9% | 0.9% | 0.9% |
| APDA | None | None | None | None | 0.02% | 0.02% | 0.02% | 0.02% |
| PMDTA | 0.025% | 0.015% | 0.025% | 0.04% | None | None | None | None |
| BTMAH | None | None | None | None | None | 0.02% | 0.04% | 0.065% |
| Water | 92.075% | 92.085% | 92.075% | 92.06% | 92.08% | 92.06% | 92.04% | 92.015% |
| Total | 100% | 100% | 100% | 100% | 100% | 100% | 100% | 100% |
| Test results | | | | | | | | |
| pH | 13.4 | 13.4 | 13.4 | 13.4 | 13.4 | 13.4 | 13.4 | 13.4 |
| Poly-Si ER (Å/min) | 3682 | 3593 | 3314 | 3396 | 3791 | 3156 | 2885 | 3002 |
| SiN ER (Å/min) | 1.04 | 1.02 | 1.08 | 1.02 | 0.99 | 0.97 | 1.03 | 0.99 |
| SiOx ER (Å/min) | 2.52 | 2.4 | 2.76 | 2.37 | 2.15 | 2.31 | 2.4 | 2.15 |

APDA = N-(3-aminopropyl)-diethanolamine
PMDTA = Pentamethyldiethylenetriamine
BTMAH = Benzyltrimethyl ammonium hydroxide
ER = etch rate The formulations without a polyamine (i.e., FE-9 to FE-12) and their test results are summarized in Table 2.

TABLE 2

| Composition [wt %] | FE-9 | FE-10 | FE-11 | FE-12 |
|---|---|---|---|---|
| TMAH | 3% | 3% | 7% | 7% |
| Periodic acid | 0.3% | 0.9% | 0.3% | 0.9% |
| Water | 96.7% | 96.1% | 92.7% | 92.1% |
| Total | 100% | 100% | 100% | 100% |
| Test results | | | | |
| pH | 13.2 | 13.1 | 13.5 | 13.4 |
| Poly-Si ER (Å/min) | 3299 | 3369 | 2699 | 3874 |
| SiN ER (Å/min) | 1.22 | 1.18 | 1.12 | 1.17 |
| SiOx ER (Å/min) | 3.16 | 3.11 | 2.28 | 2.52 |

As shown in Tables 1 and 2, FE-1 to FE-8 (all of which included a polyamine) exhibited lower SiN and/or SiOx etch rates compared to FE-9 to FE-12 (none of which included a polyamine).

What is claimed is:

1. An etching composition, consisting of:
   at least one quaternary ammonium hydroxide or a salt thereof;
   at least one oxidizing agent;
   at least one polyamine; and
   water;
   wherein the composition has a pH of at least about 13.

2. The composition of claim 1, wherein the least one quaternary ammonium hydroxide or a salt thereof comprises a tetraalkylammonium hydroxide or a salt thereof.

3. The composition of claim 1, wherein the least one quaternary ammonium hydroxide or a salt thereof comprises tetramethylammonium hydroxide, tetraethylammonium hydroxide, tetrapropylammonium hydroxide, tetrabutylammonium hydroxide, benzyltrimethylammonium hydroxide, methyltriethylammonium hydroxide, ethyltrimethylammonium hydroxide, dimethyldiethylammonium hydroxide, 2-hydroxyethyltrimethylammonium hydroxide, tetraethanolammonium hydroxide, benzyltriethylammonium hydroxide, benzyltributylammonium hydroxide, hexadecyltrimethylammonium hydroxide, or a salt thereof.

4. The composition of claim 1, wherein the at least one quaternary ammonium hydroxide or a salt thereof is in an amount of from about 0.1 wt % to about 20 wt % of the composition.

5. The composition of claim 1, wherein the at least one oxidizing agent comprises periodic acid, perchloric acid, or hydrogen peroxide.

6. The composition of claim 1, wherein the at least one oxidizing agent is in an amount of from about 0.01 wt % to about 5 wt % of the composition.

7. The composition of claim 1, wherein the at least one polyamine comprises a diamine, a triamine, or an alkanolamine comprising at least two amino groups.

8. The composition of claim 1, wherein the at least one polyamine comprises N-(3-aminopropyl)-diethanolamine or pentamethyldiethylenetriamine.

9. The composition of claim 1, wherein the at least one polyamine is in an amount of from about 0.001 wt % to about 1 wt % of the composition.

10. The composition of claim 1, wherein the water is in an amount of from about 70 wt % to about 99 wt % of the composition.

11. The composition of claim 1, wherein the composition has a pH of at most about 14.

12. The composition of claim 1, wherein the composition is substantially free of an organic solvent, a salt other than a quaternary ammonium salt, or a corrosion inhibitor.

13. A method, comprising:
    contacting a semiconductor substrate supporting a Si-containing feature with a composition of claim 1 to substantially remove the Si-containing feature.

14. The method of claim 13, wherein a pattern is formed on a surface of the semiconductor substrate and the Si-containing feature is a part of the pattern.

15. The method of claim 13, wherein the method does not substantially remove SiN or SiOx.

* * * * *